(12) United States Patent
Detzel et al.

(10) Patent No.: US 7,834,427 B2
(45) Date of Patent: Nov. 16, 2010

(54) INTEGRATED CIRCUIT HAVING A SEMICONDUCTOR ARRANGEMENT

(75) Inventors: Thomas Detzel, Villach (AT); Hubert Maier, Villach (AT); Kai-Alexander Schreiber, Villach (AT); Stefan Woehlert, Villach (AT); Uwe Hoeckele, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 777 days.

(21) Appl. No.: 11/680,320

(22) Filed: Feb. 28, 2007

(65) Prior Publication Data

US 2008/0179669 A1    Jul. 31, 2008

(30) Foreign Application Priority Data

Jan. 31, 2007    (DE)    ................... 20 2007 001 431 U

(51) Int. Cl.
*H01L 29/78*    (2006.01)
*H01L 23/52*    (2006.01)

(52) U.S. Cl. ........................ 257/639; 257/760; 257/337

(58) Field of Classification Search ................. 257/639, 257/759, 760, 337
See application file for complete search history.

(56) References Cited

U.S. PATENT DOCUMENTS

| | | | |
|---|---|---|---|
| 4,543,271 A * | 9/1985 | Peters | ........................ 427/583 |
| 6,307,213 B1 | 10/2001 | Huang et al. | |
| 6,437,424 B1 * | 8/2002 | Noma et al. | ................. 257/639 |
| 6,605,848 B2 * | 8/2003 | Ngo et al. | .................... 257/412 |
| 6,670,710 B2 * | 12/2003 | Matsunaga | ................... 257/758 |
| 2006/0014371 A1 * | 1/2006 | Rieger et al. | ................. 438/614 |
| 2006/0087770 A1 * | 4/2006 | Kato et al. | ................ 360/234.5 |
| 2006/0091451 A1 * | 5/2006 | Yamaguchi et al. | ......... 257/316 |
| 2006/0214218 A1 | 9/2006 | Shishido et al. | |
| 2007/0228567 A1 | 10/2007 | Bauer et al. | |
| 2008/0042227 A1 | 2/2008 | Asano et al. | |

FOREIGN PATENT DOCUMENTS

| | | |
|---|---|---|
| DE | 10360513 A1 | 7/2005 |
| DE | 102004047522 B3 | 4/2006 |
| DE | 112004003004 T5 | 10/2007 |
| DE | 112005003327 T5 | 11/2007 |

OTHER PUBLICATIONS

An Office Action for German Patent Application No. 10 2007 032 387.7-33 dated Feb. 2, 2009 (3 pages).

* cited by examiner

*Primary Examiner*—David Vu
*Assistant Examiner*—Earl N Taylor
(74) *Attorney, Agent, or Firm*—Dicke, Billig & Czaja, PLLC

(57) ABSTRACT

An integrated circuit including a semiconductor arrangement, a power semiconductor component and an associated production method is disclosed. One embodiment includes a carrier substrate, a first interconnect layer, formed on the carrier substrate and has at least one cutout, an insulating filling layer, formed on the first interconnect layer and the carrier substrate and fills at least one cutout, an SiON layer, formed on the filling layer, and a second interconnect layer, formed over the SiON layer.

12 Claims, 2 Drawing Sheets

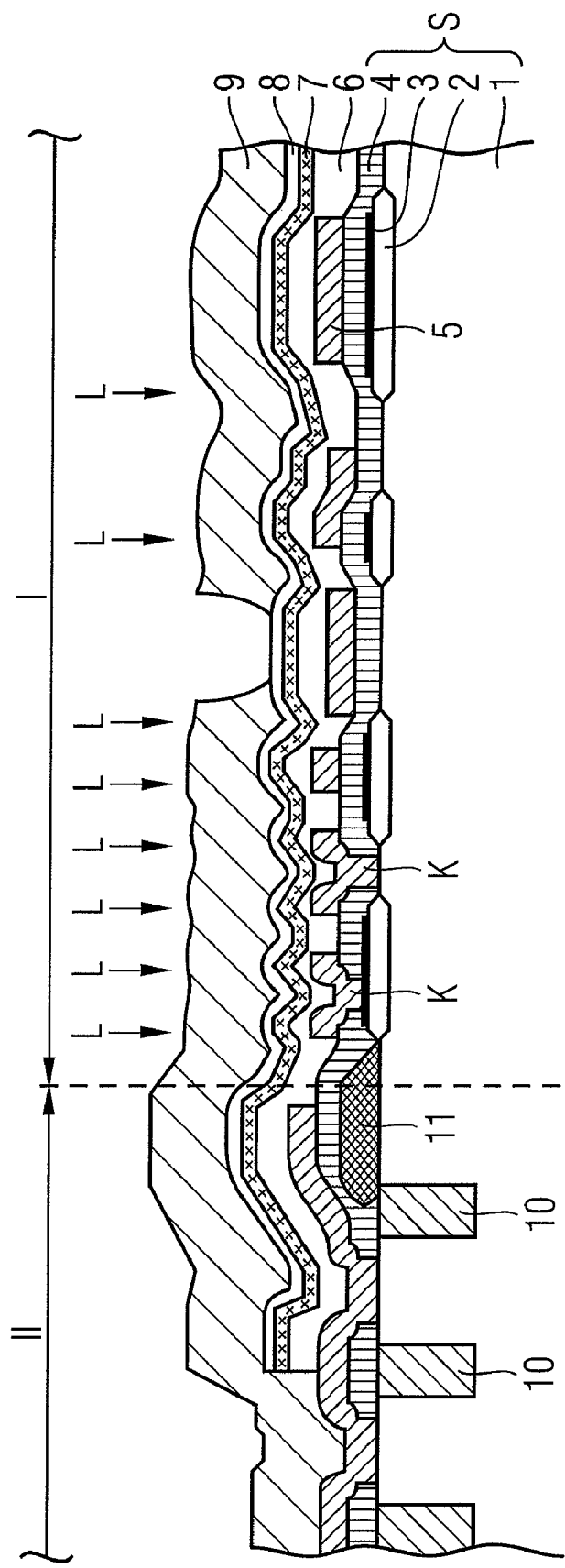

INTEGRATED CIRCUIT HAVING A SEMICONDUCTOR ARRANGEMENT

CROSS REFERENCE TO RELATED APPLICATION

This Utility Patent Application claims priority to German Patent Application No. DE 20 2007 001 431.7, filed on Jan. 31, 2007, which is herein incorporated by reference.

BACKGROUND

The present invention relates to an integrated circuit having a semiconductor arrangement, a power semiconductor component and an associated production method, and in one embodiment to a DMOS power semiconductor component with a special intermediate dielectric.

In the field of power semiconductor technology, the integration of an ion- and moisture-tight dielectric layer or of an ion- and moisture-tight intermediate dielectric in the upper region of the metallization of a semiconductor component constitutes a significant requirement.

Requirements of this type have been achieved by depositing a relatively thick passivation layer including silicon nitride, for example, or a layer sequence of silicon oxide and silicon nitride above the topmost metallization level, over the power metallization for a respective power supply, and patterning it. What is disadvantageous in this case is the formation of passivation cracks during thermal cyclic loading, such as regularly occur in particular in the case of power semiconductor components. In this case, the molding composition or potting composition exerts large mechanical stresses on the semiconductor component or chip during a temperature cycle. These forces act on the passivation, the underlying metallization layer (for example for a power supply) being plastically deformed on account of its comparatively low strength.

As a result, in particular at the edges of the metallization layer in the overlying brittle passivation layer or silicon nitride passivation, such large mechanical stresses can be produced that the passivation layer breaks. Numerous cracks arise as a result, through which mobile ions such as sodium, for example, and moisture can penetrate. The consequences are alterations of the device properties, such as, for example, threshold voltage shifts, and corrosion of the metallization layers. Furthermore, this conventional solution requires an additional photolevel for the patterning of the passivation layer, which is in turn reflected in increased costs.

As an alternative solution, in conventional semiconductor arrangements a silicon nitride layer has been integrated between an intermetal oxide and the power metallization layer. In this conventional realization, the passivation is part of the intermediate dielectric (Intermetal Dielectric, IMD), whereby one photolevel can be saved.

Furthermore, the probability of cracking is significantly reduced since the intermediate dielectric usually lies over very thin metal layers ($\leq 1$ μm), in contrast to the topmost power metallization layer thicknesses of greater than or equal to 2.5 μm. The thinner these layers, the lower their plastic deformability, for which reason cracking is inhibited. What is disadvantageous in this case, however, is that such integration of silicon nitride into the intermediate dielectric leads to gate oxide damage for which tolerance cannot be afforded particularly in the case of DMOS power semiconductor components (Diffused Metal Oxide Semiconductor) in the trenches, and to component drifts. A suspected cause in this case is the hydrogen which is incorporated in the silicon nitride layer and which can lead to severe damage to the respective semiconductor components.

Therefore, there is a need to provide a semiconductor arrangement, a power semiconductor component and an associated production method, wherein good ion- and moisture-tightness can be realized with low costs.

For these and other reasons, there is a need for the present invention.

SUMMARY

One embodiment provides an integrated circuit having a semiconductor arrangement. The integrated circuit includes a first interconnect layer, an insulating layer having at least one cutout, a second interconnect layer, and an SiON layer between the first interconnect layer and the second interconnect layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a simplified sectional view of a DMOS semiconductor component in accordance with one exemplary embodiment of the present invention.

DETAILED DESCRIPTION

Figure 1:
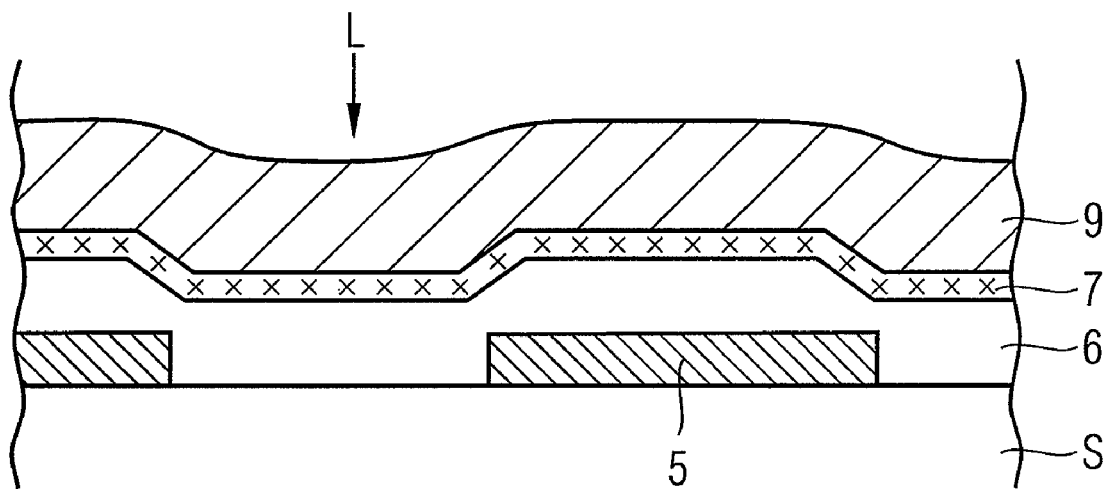
FIG. 1 illustrates a simplified sectional view of a semiconductor arrangement in accordance with one exemplary embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention relates to an integrated circuit having a semiconductor arrangement, a power semiconductor component and an associated production method, and in one embodiment to a DMOS power semiconductor component with a special intermediate dielectric.

In accordance with one embodiment, a semiconductor arrangement is provided, wherein a first interconnect layer is formed on a carrier substrate, the first interconnect layer having at least one cutout, an insulating filling layer is formed on the first interconnect layer and the carrier substrate, the filling layer filling the at least one cutout, an SiON layer is formed on the filling layer and a second interconnect layer is formed over the SiON layer.

Furthermore, a power semiconductor component may have a logic transistor region and a power transistor region, which are formed in a common semiconductor substrate, wherein an insulating carrier layer is formed at least partly at the surface of the semiconductor substrate, on which carrier layer is formed a first interconnect layer having cutouts at least in the logic transistor region, an insulating filling layer is formed on the first interconnect layer and on the carrier layer, which fills the cutouts, an SiON layer is formed on the filling layer, and a second interconnect layer is formed over the SiON layer.

Furthermore, a method for producing a semiconductor arrangement is proposed, including: forming a carrier substrate, forming a first interconnect layer on the carrier substrate, patterning the first interconnect layer in order to produce at least one cutout, forming an insulating filling layer on the patterned interconnect layer and the carrier substrate, forming an SiON layer on the insulating filling layer, and forming a second interconnect layer over the SiON layer.

In one embodiment of the present invention, an intermediate dielectric is realized between a first and second interconnect layer by at least one insulating filling layer and an SiON layer formed thereon. On account of saving a photolevel, production costs can thus be significantly reduced. Furthermore, an intermediate dielectric of this type exhibits outstanding ion- and moisture-tightness, in which case in particular the occurrence of cracks in a passivation or in the intermediate dielectric can be reliably prevented and, consequently, the device properties of components realized in the semiconductor material, for example, cannot be adversely influenced.

By way of example, the layer thickness of the SiON layer may be between 0.2 μm and 1 μm and have an optical refractive index of approximately 1.7. A layer of this type exhibits particularly good properties with regard to its ion- and moisture-tightness.

The insulating filling layer may constitute for example an HDP oxide layer having a layer thickness of 0.8 μm to 1.5 μm. This results in a sufficient flattening of the topography in the first interconnect layer, whereby in particular the overlying SiON layer can realize a sufficient edge coverage and be buffered with regard to its stress in particular during a thermal cyclic loading.

Furthermore, by way of example, a covering layer may be formed between the SiON layer and the second interconnect layer, which has a layer thickness of approximately 600 nm and has in particular SiO or SiC. A covering layer of this type serves as a reinforcing layer of the SiON layer and increases the mechanical stability of the SiON layer serving as an ion- and moisture-tight barrier. The SiON layer can thereby be reliably prevented from cracking.

In one example embodiment of the present invention, an intermediate dielectric is realized between a first and second interconnect layer by at least one insulating filling layer and an SiON layer formed thereon. On account of saving a photolevel, production costs can thus be significantly reduced. Furthermore, an intermediate dielectric of this type exhibits outstanding ion- and moisture-tightness, in which case in particular the occurrence of cracks in a passivation or in the intermediate dielectric can be reliably prevented and, consequently, the device properties of components realized in the semiconductor material, for example, cannot be adversely influenced.

By way of example, the layer thickness of the SiON layer may be between 0.2 μm and 1 μm and have an optical refractive index of approximately 1.7. A layer of this type exhibits particularly good properties with regard to its ion- and moisture-tightness.

The insulating filling layer may constitute for example an HDP oxide layer having a layer thickness of 0.8 μm to 1.5 μm. This results in a sufficient flattening of the topography in the first interconnect layer, whereby in particular the overlying SiON layer can realize a sufficient edge coverage and be buffered with regard to its stress in particular during a thermal cyclic loading.

Furthermore, by way of example, a covering layer may be formed between the SiON layer and the second interconnect layer, which has a layer thickness of approximately 600 nm and has in particular SiO or SiC. A covering layer of this type serves as a reinforcing layer of the SiON layer and increases the mechanical stability of the SiON layer serving as an ion- and moisture-tight barrier. The SiON layer can thereby be reliably prevented from cracking.

FIG. 1 illustrates a simplified sectional view for illustrating a semiconductor arrangement and in particular an intermediate dielectric between two interconnect layers such as, for example, a topmost metallization layer for a power supply and an underlying wiring layer.

In accordance with FIG. 1, a first interconnect layer 5 is formed on a carrier substrate S, the first interconnect layer having at least one cutout L as far as the carrier substrate S. Such cutouts L are produced for example during a patterning of the first interconnect layer 5 in order to produce interconnects that are separate from one another, for example. In principle, such a cutout L may also constitute a depression (not illustrated) in the interconnect layer.

By way of example, the first interconnect layer 5 may constitute a metallization layer for realizing a wiring for a semiconductor component (not illustrated). The first interconnect layer is usually a thin metal layer having layer thicknesses of less than or equal to 1 μm, wherein Al, Cu, Ni and/or W or alloys with corresponding material constituents can be used as material.

An insulating filling layer 6 is furthermore formed on the first interconnect layer 5 and the carrier substrate S in the region of the cutouts or gaps L, the filling layer filling at least the cutout L. By way of example, a spin-on glass, a Flow-Fill® material or a photoimide can be spun on. In this case, the intention is, in particular, to fill the cutouts L and to flatten or bevel the steep edges at the first interconnect layer 5.

In one embodiment, an HDP oxide layer (High Density Plasma Oxide) is deposited over the whole area by an HDP-CVD method (High Density Plasma Chemical Vapor Deposition) as an insulting filling layer 6 of this type. This HDP deposition has the effect that the cutouts or gaps L between the partial regions of the first interconnect layer 5 are filled with oxide in a manner free of shrink holes, i.e. free of voids, and steep edges are beveled. The disadvantageous topography originating from the first interconnect layer 5 with its cutouts L is thereby alleviated or attenuated.

In this case, the filling layer 6 has a layer thickness of 0.5 μm to 5 μm, and in one embodiment a layer thickness of 0.8 μm to 1.5 μm. Since it is intended to fill the cutouts L of the first interconnect layer completely, the filling layer 6 has a layer thickness corresponding approximately to the layer thickness of the first interconnect layer 5.

An SiON layer 7 is subsequently formed over the whole area at the surface of the insulating filling layer 6. This silicon oxynitride layer serves as an actual ion and moisture barrier, in which case, on account of the altered deposition parameters and precursor gases by comparison with a conventional silicon nitride process and the layer properties altered therefrom, this layer and its material do not have a damaging effect on semiconductor components possibly situated in the carrier substrate S. It was thus possible to demonstrate, for example, that no gate oxide damage or component drifts arise.

On account of the edge-breaking filling layer 6, the SiON layer 7 can be formed highly conformally, i.e. with uniform thickness. By way of example, the SiON layer is deposited in a plasma reactor chamber using the following precursor gases $SiH_4$, $NH_3$, $N_2O$, $N_2$.

In this case, a layer thickness of the SiON layer 7 is 0.2 μm to 1 μm. The stoichiometric properties of the SiON layer 7 are determined by the optical refractive index of the layer, for example, which is approximately 1.7, for example.

Finally, a second interconnect layer 9 can be formed at the surface of the SiON layer 7, the second interconnect layer constituting for example a topmost metallization layer for a power supply. Such a power metallization has layer thicknesses of 2.0 to 15 μm, for example, and can carry the high current densities required particularly in power semiconductor components.

In contrast to passivation processes that are conventionally used, a photolevel and hence significant costs are saved according to the invention. Cracking in the passivation that usually lies above the topmost metallization layer or the power metal is therefore reliably avoided.

Furthermore, it was possible to reliably demonstrate that the layer sequence with an integrated SiON layer that is used as intermediate dielectric (IMD, Intermetal Dielectric) constitutes an effective protection against mobile ions and moisture. Thus, by way of example, it was possible to demonstrate the tightness with respect to mobile ions by a specifically developed sodium test. No cracking occurs even in the case of very great thermal or chemical loadings, for which reason no contaminations pass into critical component regions of the carrier substrate S.

Furthermore, the SiON layer does not exhibit any adverse influencing of the semiconductor components or circuits that are usually realized in the carrier substrate S.

In accordance with a further exemplary embodiment (not illustrated), an insulating covering layer 8 may furthermore be formed between the SiON layer 7 and the second interconnect layer 9. By way of example, a TEOS-based (tetraethyl orthosilicate) or $SiH_4$-based oxide layer is deposited as the covering layer 8. The covering layer 8 may have for example a layer thickness of 300 nm to 800 nm, and in particular a layer thickness of 600 nm.

By way of example, $Si_wO_xN_yH_z$ or $Si_wO_xC_yH_z$ is produced as the covering layer 8, where x, y, z and w represent the stoichiometry in atomic percent of the compound. In particular, the covering layer 8 may include SiO or SiC. In this case, the insulating covering layer 8 serves in particular for improving the mechanical stability of the intermediate dielectric and in particular of the SiON layer 7. In this case, the layer and the underlying layers can be patterned by an isotropic followed by an anisotropic plasma etch. In principle, the etch can also be carried out purely anisotropically.

The topmost metallization layer or second interconnect layer 9 that is finally formed again includes aluminum, for example. In principle, however, Cu, Ni, NiPd and/or NiP can be used as materials for the layer in a similar manner to the first interconnect layer 5. A semiconductor arrangement or intermediate dielectric extended by the connecting layer 8 in this way has, in particular, an improved mechanical stability and also thermal stability such as may occur in particular in the case of thermal cyclic loadings and power semiconductor components.

FIG. 2 illustrates a simplified sectional view of a DMOS power semiconductor component, wherein the intermediate dielectric used in FIG. 1 is employed.

A typical construction of a DMOS power semiconductor component is illustrated in accordance with FIG. 2, wherein DMOS power transistors are integrated in a DMOS power transistor region II and a protection or logic circuit is integrated in a logic transistor region I, in a semiconductor substrate 1. For simplification, respective doping zones within the semiconductor substrate 1 are not illustrated in this case.

In the DMOS power transistor region II, it is possible for example to form trenches 10 for the realization of vertical field effect transistor structures, in which case, within the trenches 10, an electrically conductive layer may be formed as a gate on a gate dielectric (not illustrated).

By way of example, field insulations 2 such as, for example, LOCOS regions (LOCal Oxidation Of Silicon) may be formed in partial regions of the logic transistor region I. Polycrystalline semiconductor layers 3 may furthermore be formed at their surfaces. Furthermore, at an interface between the logic transistor region I and the DMOS power transistor region II, a field plate 11 may also be formed directly at the surface of the semiconductor substrate 1, whereby increased field strengths can be reliably prevented in this region.

By way of example, silicon is used as the semiconductor material for the monocrystalline substrate 1 and the polycrystalline layer 3, but any other semiconductor materials may also be used.

Furthermore, a carrier insulating layer 4, having BPSG (borophosphosilicate glass) for example, may be formed at the surface of the semiconductor substrate 1, the field insulating layers 2 and the polycrystalline semiconductor layers 3. At predetermined locations, the insulating layer 4 may also be opened for the realization of substrate contacts.

The semiconductor substrate 1 with the overlying layers 2, 3 and 4 is also referred to hereinafter as carrier substrate S, such as may be present in a similar form in the exemplary embodiment in accordance with FIG. 1 as well.

Afterward, a first interconnect layer 5 may be formed on the patterned carrier insulating layer 4 or the carrier substrate S. In this case, Al, Cu, Ni and/or W or alloys with corresponding material constituents may once again be deposited over the whole area as metallization layer. Afterward, a patterning of this metallization level is carried out, thereby resulting in the first interconnect layer 5 with its cutouts or gaps L in particular in the logic transistor region I. In this case, the first interconnect layer 5 typically has a topography of 1 to 2 μm.

Afterward, the method processes for forming the respective layers that have been described with reference to FIG. 1 are carried out, for which reason reference is made to the description of FIG. 1 in order to avoid repetition.

Accordingly, in order to fill the narrow gaps L between the interconnects of the first interconnect layer 5 and also above contacts K, firstly a filling layer 6 is formed and in particular a HDP oxide (High Density Plasma Oxide) is deposited. Such an HDP-CVD method (High Density Plasma Chemical Vapor Deposition) has the properties of closing even extremely small gaps L and of flattening or alleviating the sharp edges produced during the etching of the first interconnect layer 5.

By way of example, the HDP oxide is produced at a power of 7400 W and a flow rate of 126 sccm for Ar, of 140 sccm (standard cubic centimeters) for $O_2$ and of 79.5 sccm for $SiH_4$.

In principle, it is also again possible to use a different gap-filling dielectric such as, for example, the spin-on glasses, Flow-Fill® materials or photoimide mentioned with respect to FIG. 1. Furthermore, optional planarization processes may also be employed in addition. In this case, the Flow-Fill® method constitutes a deposition from $H_2O_2$ and silane at 10° C. wafer temperature. The resultant layer is subjected to heat treatment in a furnace after deposition.

The layer thickness of the filling layer 6 is usually chosen according to the topography height of the underlying interconnect layer 5. Given a layer thickness of 1 μm for the first interconnect layer 5, accordingly approximately 0.8 to 1.5 μm of the HDP oxide layer 6 are deposited. If even larger topographies occur at the contacts K, accordingly even higher layer thicknesses can be used.

The actual SiON ion barrier layer 7 is deposited next. In one embodiment, the layer thickness is 400 nm, for example, since significantly thinner layers are not ion-tight and significantly thicker layers may tend toward cracking. The stoichiometric properties of the SiON layer 7 are determined by the optical refractive index, where the latter should be approximately 1.7.

For the deposition of the SiON layer 7 it is possible to use a plasma reactor identical to that for the deposition of the HDP oxide layer 6, whereby the method can be simplified and the costs can be reduced. $SiH_4$, $NH_3$, $N_2O$ and $N_2$ can once again be used as precursor gases. By way of example, a temperature of approximately 400° C., a pressure of approximately 400 pascals (3.0 torr), a power of approximately 160 watts and a flow rate of 40 sccm (standard cubic centimeters) for $SiH_4$, of 50 sccm for $NH_3$, of 3000 sccm for $N_2$ and of 90 sccm for $N_2O$ are used in this case.

In order to improve the mechanical stability of the entire layer sequence, it is once again possible to use a further insulating covering layer 8 that is formed over the whole area at the surface of the SiON layer 7. By way of example, TEOS- or $SiH_4$-based oxides can be used for this.

During the production of a TEOS-based oxide, for example the temperature is set to 430° C., the pressure is set to approximately 1133 Pa (8.5 torr) and the power is set to approximately 700 W at flow rates of 1000 sccm (standard cubic centimeters) for $O_2$ and of 2800 sccm for HeCar. The deposition time is e.g., approximately 210 s.

The patterning is effected once again as in FIG. 1 by an isotropic followed by an anisotropic plasma etch, in which case a purely anisotropic etch may also be carried out.

Finally, once again as the power metallization layer the second interconnect layer 9 is formed with a significantly higher layer thickness of 2 to 15 μm, for example, in which case once again the same materials as or similar materials to the first interconnect layer 5 can be used, i.e. Cu, Ni, NiPd and/or NiP.

In the embodiment of the DMOS power semiconductor component illustrated in FIG. 2, too, the optional insulating covering layer 8 between the SiON layer 7 and the second interconnect layer 9 may also be obviated, but a lower mechanical strength is to be expected in that case.

The invention has been described above by way of example on the basis of a DMOS power semiconductor component with trench transistors. However, it is not restricted thereto and also encompasses alternative power semiconductor components in the same way.

Furthermore, the invention has been described by of example on the basis of materials which are used for silicon semiconductor technology. It goes without saying that alternative semiconductor materials and associated insulating materials can also be used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor component comprising:
   a logic transistor region and a power transistor region, formed in a common semiconductor substrate, wherein an insulating carrier layer is formed at least partly at the surface of the semiconductor substrate, on which insulating carrier layer is formed a first interconnect layer having cutouts at least in the logic transistor region;
   an insulating filling layer is formed on the first interconnect layer and on the insulating, carrier layer, which fills the cutouts;
   an SiON layer is formed on the filling layer; and
   a second interconnect layer is formed over the SiON layer.

2. The power semiconductor component of claim 1, comprising wherein the SiON layer has a layer thickness of 0.2 μm to 1 μm.

3. The power semiconductor component of claim 1, comprising wherein the SiON layer has an optical refractive index of approximately 1.7.

4. The power semiconductor component of claim 1, comprising wherein the insulating filling layer constitutes an HDP oxide layer.

5. The power semiconductor component of claim 1, comprising wherein an insulating covering layer is furthermore formed between the SiON layer and the second interconnect layer.

6. The power semiconductor component of claim 1, comprising wherein the power transistor region is separated from the logic transistor region at the surface of the semiconductor substrate by a field plate.

7. A DMOS power semiconductor component, comprising:
   a logic transistor region and a DMOS power transistor region having a multiplicity of trenches filled with a gate dielectric and a gate layer formed thereon, wherein the regions are formed in a common semiconductor substrate;
   an insulating carrier layer formed at least partly at the surface of the semiconductor substrate, on which insulating carrier layer is formed a first interconnect layer having cutouts at least in the logic transistor region;
   an insulating filling layer formed on the first interconnect layer and on the insulating carrier layer, which fills the cutouts;
   an SiON layer formed on the insulating filling layer;
   an insulating covering layer formed on the SiON layer; and
   a second interconnect layer formed on the insulating covering layer.

8. The DMOS power semiconductor component of claim 7, comprising wherein the SiON layer has a layer thickness of 0.2 μm to 1 μm.

9. The DMOS power semiconductor component of claim 7, comprising wherein the SiON layer has an optical refractive index of approximately 1.7.

10. The DMOS power semiconductor component of claim 7, comprising wherein the insulating filling layer constitutes an HDP oxide layer.

11. The DMOS power semiconductor component of claim 7, comprising wherein the insulating covering layer constitutes a TEOS- or $SiH_4$-based oxide layer having a layer thickness of 300 nm to 800 nm, in particular 600 nm.

12. The DMOS power semiconductor component of claim 7, comprising wherein the first and/or second interconnect layer has Al.

\* \* \* \* \*